United States Patent [19]

Maruyama

[11] Patent Number: 4,633,811
[45] Date of Patent: Jan. 6, 1987

[54] PLASMA CVD APPARATUS
[75] Inventor: Kazumi Maruyama, Kanagawa, Japan
[73] Assignee: Fuji Electric Co., Ltd., Japan
[21] Appl. No.: 691,861
[22] Filed: Jan. 16, 1985
[30] Foreign Application Priority Data Mar. 28, 1984 [JP] Japan .................................. 59-60344

[51] Int. Cl.⁴ ............................................ C23C 13/08
[52] U.S. Cl. .................................... 118/723; 118/50.1
[58] Field of Search ...................... 118/723, 50.1, 663, 118/696; 427/39, 38; 156/345, 643

[56] References Cited

U.S. PATENT DOCUMENTS

| 4,292,153 | 9/1981 | Kudo et al. | 156/643 X |
| 4,381,965 | 5/1983 | Maher, Jr. et al. | 414/417 X |
| 4,464,223 | 8/1984 | Gorin | 156/643 |
| 4,478,173 | 10/1984 | Doehler | 427/39 X |
| 4,500,563 | 2/1985 | Ellenberger et al. | 118/723 X |

FOREIGN PATENT DOCUMENTS 48416 3/1983 Japan .

Primary Examiner—Richard Bueker
Attorney, Agent, or Firm—Brumbaugh, Graves, Donohue & Raymond

[57] ABSTRACT

In the particular embodiments described in the specification, a plasma CVD apparatus has a plurality of pairs of electrodes and equal discharges are attained by controlling the power supplied to the high frequency electrodes independently of one another so as to effect the formation of uniform films. Electromagnetic mutual interference between the electrodes is reduced by allowing the high frequency power supplies for supplying the power to function independently and providing a phase regulator if necessary.

5 Claims, 7 Drawing Figures ing the arrangement of the power supplies for the embodiments of FIGS. 1 and 3, respectively.

PLASMA CVD APPARATUS

BACKGROUND OF THE INVENTION

This invention relates to plasma CVD apparatus for forming thin films, including noncrystalline semiconductor films such as noncrystalline or amorphous silicon (hereinafter called a-Si for short), nitrate films such as $SiN_x$ ($x=0-4/3$) and oxide films $SiO_x$ ($x=0-2$), that can be obtained by glow discharge composition.

Heretofore, plasma CVD apparatus for manufacturing plates with thin films have included a high-frequency electrode and a substrate electrode for holding a substrate, mounted in face-to-face relation in a vacuum reaction chamber. To increase the number of substrates to be processed, a plurality of electrode pairs are alternately connected in parallel, substrates used to form the thin films are arranged on both sides of each of the substrate electrodes, and power is supplied to all the electrodes from a single power supply to provide a mass production type apparatus, as disclosed in Japanese laid-open application No. 48416/1983.

A thin film is normally formed by applying an AC electric field across the electrodes at a gas pressure of about 0.1 to 10 torr and decomposing a gas in the chamber by means of a glow discharge. Since a single power supply is used to apply the electric field to all electrodes, all of the electrode pairs are connected in parallel. If the size of the substrate is increased when this method is used, uniformity of the thin film formed on all of the substrates in an array cannot be attained at a frequency of 13.56 Mhz even though a film of good quality is normally obtainable at that frequency. On the other hand, if a frequency of approximately 100 KHz is used, the electrical stress applied to the film is very large and satisfactory film properties are not uniformly obtained when as a-Si film is formed. The reasons for the inability to obtain film uniformity, particularly at high frequency, are that isometric discharging is impossible because the load impedances of the electrodes are different from one another and, in addition, the discharge condition changes with time. When the substrates are arranged in an array another disadvantage is that discharging is unstable because of electromagnetic interference between the electrodes.

Accordingly, an object of the present invention is to provide an apparatus for manufacturing plates having thin films which overcomes the above-mentioned disadvantages of the prior art.

Another object of the invention is to provide such an apparatus having pairs of electrodes in an array wherein uneven discharge problems at high frequency are eliminated and electromagnetic interference is avoided so that uniform thin films can be formed on all substrates with excellent reproducibility even if substrates having a large area are used.

SUMMARY OF THE INVENTION

These and other objects of the invention are attained by providing apparatus in which a plurality of pairs of high frequency electrodes arranged in an array are connected to separate power supply output units, each output unit being capable of controlling the applied power independently of the others. A power supply output unit is defined as a terminal at which output power from the power supply is available at a level which is adjustable and substantially independent of the level at the other output units. In the invention, there is included a power supply means which provides at least a pair of output units and the high frequency electrodes are connected into at least two sets, each connected to a separate output unit. With this arrangement the same amount of power is supplied to each pair of electrodes and the discharges are uniform even if the load impedances of the electrodes are different.

In a preferred embodiment of the present invention, the plurality of output units which can be controlled independently of one another are supplied by a single power source so as to avoid high frequency electric field phase shift as well as electromagnetic interference, thereby assuring that the output units will supply power in the same phase relation to all of the electrodes.

BRIEF DESCRIPTION OF THE DRAWINGS

Further objects and advantages of the invention will be apparent from a reading of the following description in conjunction with the accompanying drawings, in which.

DESCRIPTION OF PREFERRED EMBODIMENTS

Figure 1:
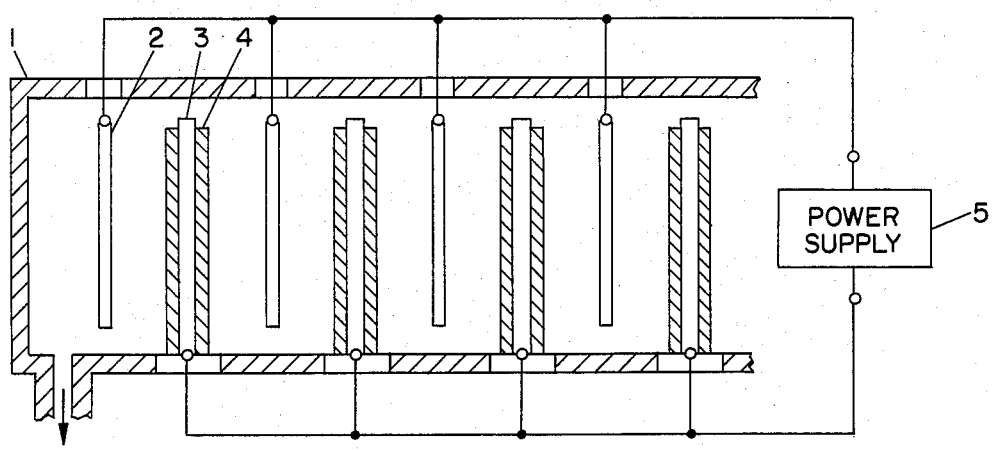
FIG. 1 is a schematic cross-sectional view illustrating a conventional plasma CVD apparatus.

FIG. 1 of the drawings shows a conventional plasma CVD apparatus comprising a vacuum chamber containing four pairs of electrodes 2 and 3. Two plate substrates 4 are mounted on opposite sides of each substrate electrode 3 and the pairs of adjacent electrodes are connected to a high frequency power supply 5. As discussed above, when the electrodes are large and are energized at high frequency, non-uniform films are produced, whereas, if lower frequency is used, satisfactory film properties may not be obtained.

Figure 2:
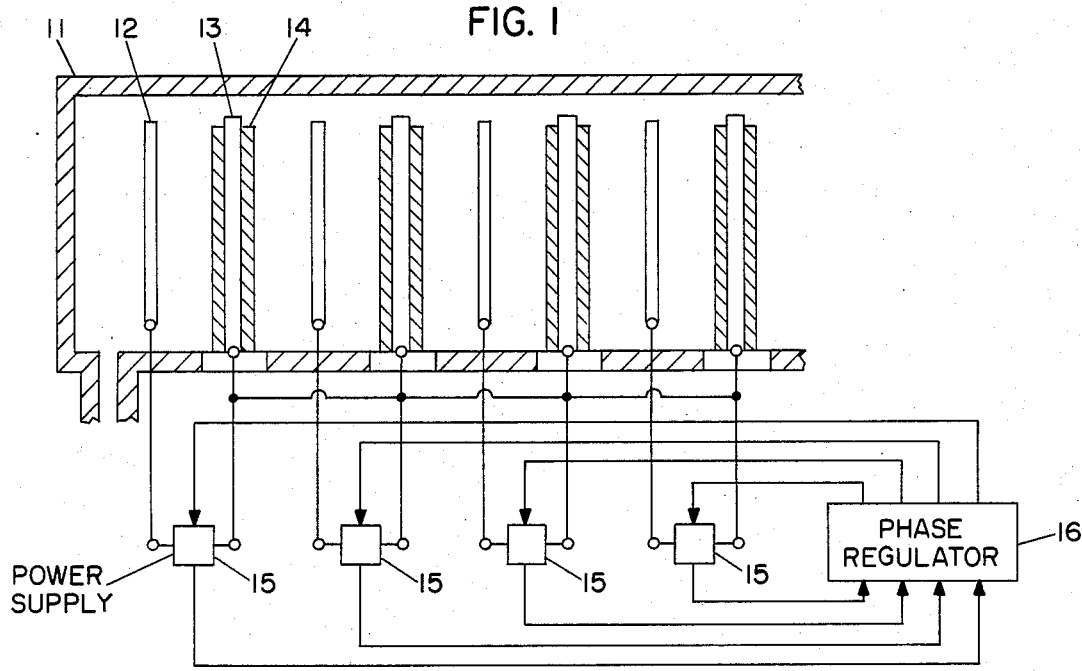
FIG. 2 is a schematic cross-sectional view showing a representative embodiment of the present invention.

FIG. 2 illustrates a first embodiment of the present invention wherein a series of high frequency electrodes 12 and substrate electrodes 13 are alternately positioned in a row and a series of high frequency power supplies 15 are individually connected across each pair of high frequency electrodes and substrate electrodes, respectively. As shown, substrate electrodes 13 are connected together to be in phase with one another and may all be grounded but it is not always necessary to ground them. A frequency of 13.56 MHz is usually employed for the high frequency field but, when nitrate film are to be formed, a frequency of about 50 KHz to 500 KHz is preferred. In the embodiment illustrated in FIG. 2, the output of each power supply 15 is controlled by a phase regulator 16 so as to provide the desired phase for each individual power supply so that all the electrodes 12 may be kept essentially in phase.

Since the power to be applied to each pair of electrodes can be individually regulated by making the high frequency power supplies independent of one another, it is possible to allow all of the electrodes to discharge uniformly even if the shape of each electrode is different from the others. Because the phase of each of the high frequency supplies is controlled, the power is prevented from flowing backward, so to speak, and producing a phenomenon in which the reflected wave of one of the power supplies becomes abnormally large because of electromagnetic mutual interference between the electrodes.

In order to confirm this result, an a-Si film-forming experiment was carried out using an apparatus comprising three high frequency electrodes and two substrate electrodes placed between them. When a high frequency electric field was applied by one power supply to the three high frequency electrodes in the manner shown in FIG. 1, the variation in film thickness on 40 cm square glass plate substrates attached to both sides of each substrate electrode was as high as ±28%. In particular, the a-Si film thickness formed on the substrates located on the sides of the high-frequency electrodes placed facing the central electrode was only about 40% of that on the substrates facing the external high frequency electrodes. This was evidently due to the lack of uniformity in the power supplied to the high frequency electrodes.

On the other hand, the same experiment with the arrangement shown in FIG. 2 but without phase regulation reduced the variation in film thickness on the substrates to ±6% since the power supplied to each high frequency electrode was regulated to be essentially uniform. Control of the film thickness in this manner was accomplished by the use of individual power supplies to form films without employing a phase regulator. However, mutual electromagnetic interference was large in this case and its magnitude reached approximately 5 to 30% of the net power applied. In addition, completely satisfactory matching conditions were not possible.

Figure 3:
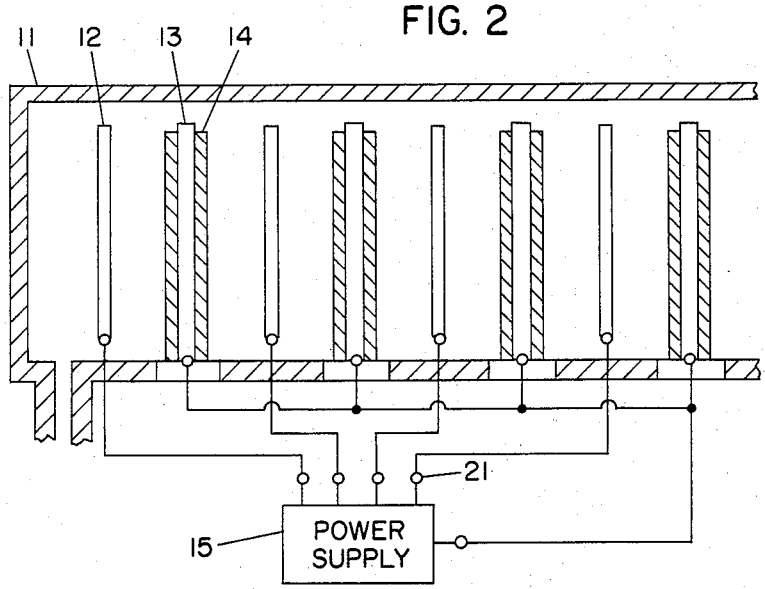
FIGS. 3, 6 and 7 are schematic cross-sectional views illustrating additional embodiments of the present invention.
Figure 4:
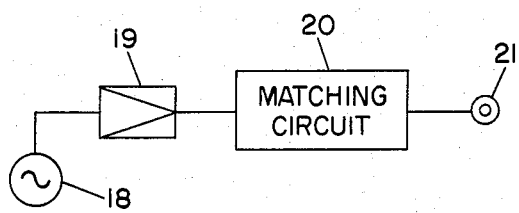
FIGS. 4 and 5 are schematic circuit diagrams showing the arrangement of the power supplies for the embodiments of FIGS. 1 and 3, respectively.
Figure 5:
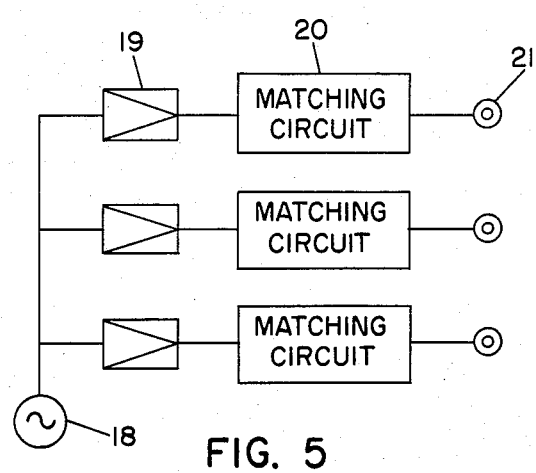

FIG. 3 illustrates another embodiment of the present invention which differs from the embodiment shown in FIG. 2, primarily in the method of phase regulation. FIG. 4 illustrates the details of the high frequency power which normally is used in the arrangement of supply of FIG. 1, which basically comprises a source 18, an isolation amplifier or buffer 19 including a conventional power controller for varying the output level or the like, a matching circuit 20, and an output terminal or unit 21. FIG. 5 shows the details of the high frequency power supply which is used in the inventive embodiment 15 of FIG. 3 which comprises a single source 18 and a series of amplifiers 19 and corresponding matching circuits 20, each supplying a separate terminal or output unit 21.

When separate power supplies are used and the phases are matched by a phase regulator as described in connection with FIG. 2, all of the oscillation frequencies of the power supplies must coincide exactly. It is extremely difficult to do this when a quartz oscillator having a discrete frequency is used as a power supply or when a high frequency in the megahertz band is used.

On the other hand, no interference beat signal resulting from differences in the aforementioned oscillation frequencies can occur in the preferred arrangement of FIG. 5 because a single power supply and so a single oscillation frequency is used. This may be supplied by any conventional high frequency source. Another advantage of the invention results from the simplicity of construction of the power supply, enabling the cost to be reduced and permitting integration of the power supplies and simplified control.

Figure 6:
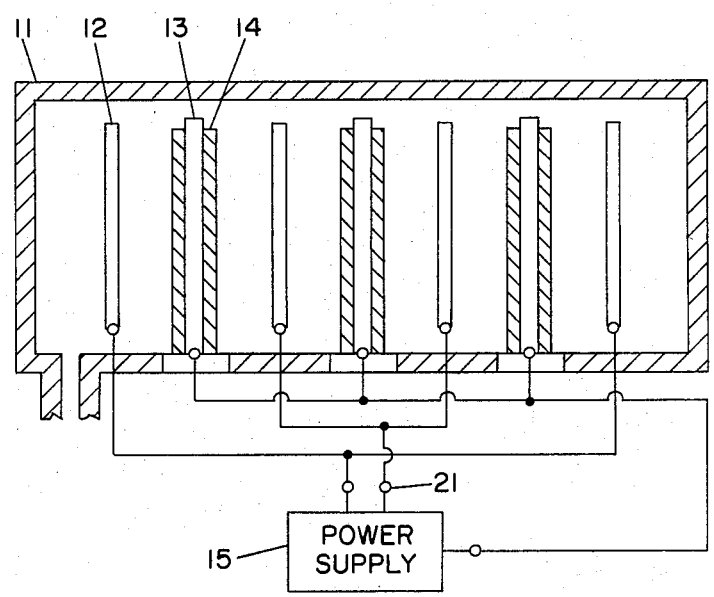

FIG. 6 illustrates still another embodiment of the invention. This embodiment differs from that of FIG. 3 in that the set of electrodes having equivalent geometrical shape are connected in parallel to an outlet terminal 21 of a high frequency power supply 15. As shown, the set of the two outer high frequency electrodes are connected together to one terminal or output unit 21 and the set of the electrodes are connected together to a different terminal or output unit. When geometrical shapes are equivalent, the load impedances during discharge are also the same. Accordingly, these electrodes discharge uniformly even though they are connected together so that they can be completely controlled by adjusting the length of the conductors from the output terminal so as to regulate the impedance in each of the electrode circuits. Since the output units of the high frequency power supply can be reduced in size, this permits a further advantageous simplification in the arrangement as compared with FIG. 3. By using apparatus of the type described having three high frequency electrodes, an experiment was carried out with the set of the two external high frequency electrodes being symmetrical in shape and being connected together to the same output unit and the set of the single inner high frequency electrode being connected to a different output unit. The variation in film thickness on the substrates facing the electrodes was a maximum of ±3%, thus presenting no difficulty.

Figure 7:
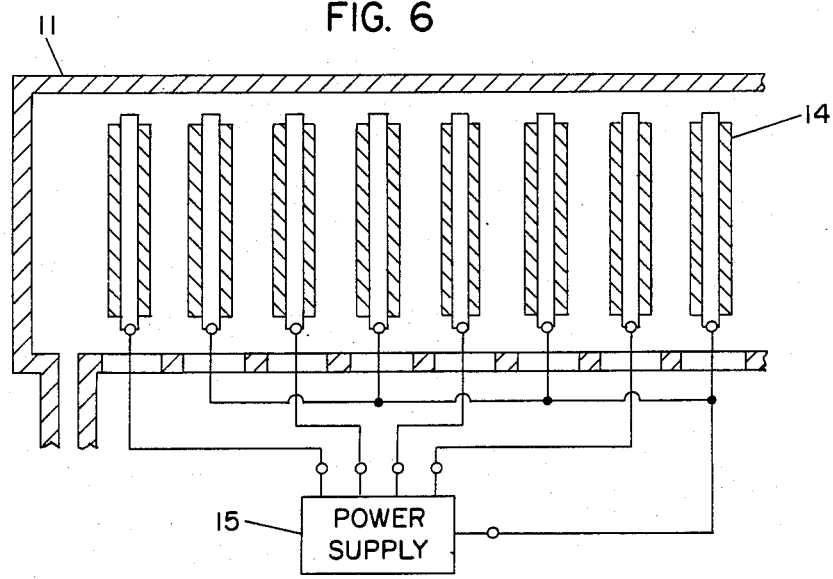

FIG. 7 illustrates still another embodiment which differs from that of FIG. 3 in that substrates are provided on both sides of the high frequency electrodes 12 as well as on the substrate electrodes 13, thereby doubling the number of substrates that can be produced. Although the substrate electrodes 13 may be grounded, it is preferred that the electrodes 13 not grounded because electric fields on the high frequency electrode and substrate electrode sides will then be unformly distributed. With this arrangement, excellent uniformity of film thickness can be realized when thin films are formed.

I claim:

1. A plasma CVD apparatus comprising:
   a power supply means comprising a high frequency power source, a plurality of amplifiers each supplied by said source, and a plurality of matching circuit means each supplied from a different one of said amplifiers, and a plurality of output units each supplied by a respective one of the matching circuit means, and a common terminal;
   a reaction chamber;
   a plurality of electrodes disposed in spaced face-to-face relation within the chamber, at least each alternate electrode of the plurality being arranged to support on opposite faces thereof a substrate for receiving a thin film produced by a glow discharge, each of said alternate electrodes being connected to said common terminal and the remaining electrodes of the plurality being connected into at least two separate sets, each separate set being connected to a different one of the plurality of output units whereby the amount of power supplied to each adjacent pair of electrodes may be separately regulated to be substantially the same.

2. A plasma CVD apparatus in accordance with claim 1 in which said remaining electrodes are each connected separately to a different one of a plurality of output units and said high frequency power supply means comprises a like plurality of output units.

3. A plasma CVD apparatus in accordance with claim 1 in which the number of remaining electrodes is odd, including at least a pair of outer electrodes and at least one inner electrode, and in which said outside electrodes are connected together to form one set and in which said inner electrodes are connected together to form a different set.

4. A plasma CVD apparatus in accordance with claim 1 in which each said remaining electrode is also arranged to support, on opposite faces thereof, a substrate for receiving a thin film produced by a glow discharge, and in which each of said remaining electrodes is connected to a different output unit, and said high frequency power supply means comprises a like plurality of output units.

5. A plasma CVD apparatus comprising a reaction chamber, a plurality of electrodes disposed in face-to-face relation within said chamber, a plurality of high frequency sources of the same high frequency, and phase regulating means for regulating the phase of the output of each of the high frequency sources, each adjacent pair of said plurality of electrodes being supplied with the regulated output of a different one of said high frequency sources, and said phase regulating means being adjusted to keep the regulated outputs supplied to the pairs of electrodes in phase.

* * * * *

UNITED STATES PATENT AND TRADEMARK OFFICE
CERTIFICATE OF CORRECTION

PATENT NO. : 4,633,811
DATED : Jan. 6, 1987
INVENTOR(S) : Kazumi Maruyama

It is certified that error appears in the above-identified patent and that said Letters Patent is hereby corrected as shown below:

Title page, item (73), "Fuji Electric Co., Ltd." should read
--Fuji Electric Corporate Research and Development, Ltd.--.

Col. 2, line 55, "film" should read --films.

Col. 3, line 39, after "power" insert --supply--;
    line 40, delete "supply";
    line 45, after "supply" insert --15--;
    line 46, after "embodiment" delete "15".

Col. 4, line 8, "impedences" should read --impedances--;
    line 33, after "not" insert --be--.

Signed and Sealed this

Fifteenth Day of June, 1993

Attest:

MICHAEL K. KIRK

Attesting Officer

Acting Commissioner of Patents and Trademarks